US006963811B2

(12) United States Patent
Weger

(10) Patent No.: US 6,963,811 B2
(45) Date of Patent: Nov. 8, 2005

(54) METHOD AND APPARATUS FOR IMPROVED DETECTION OF MULTISYNCHRONOUS SIGNALS TITLE

(75) Inventor: Alan J. Weger, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 60 days.

(21) Appl. No.: 10/671,037

(22) Filed: Sep. 25, 2003

(65) Prior Publication Data

US 2005/0071100 A1 Mar. 31, 2005

(51) Int. Cl.$^{7}$ ........ G01R 13/00

(52) U.S. Cl. ........ 702/69; 382/132

(58) Field of Search ........ 702/69, 72, 189, 702/75; 324/601, 752; 714/45, 724, 726; 365/233; 348/300; 375/371; 382/132, 151

(56) References Cited

U.S. PATENT DOCUMENTS

2003/0031353 A1 * 2/2003 Baertsch et al. ............ 382/132
2003/0056154 A1 * 3/2003 Edwards et al. .............. 714/45
2003/0141879 A1 * 7/2003 Wilsher ...................... 324/601
2003/0146768 A1 * 8/2003 Kash et al. ................. 324/752
2003/0156750 A1 * 8/2003 Dajee et al. ................ 382/151

* cited by examiner

*Primary Examiner*—Michael Nghiem
*Assistant Examiner*—Xiuqin Sun
(74) *Attorney, Agent, or Firm*—Scully, Scott, Murphy & Presser; Richard M. Ludwin

(57) ABSTRACT

Disclosed are a method and system for processing timing information with respect to an electronic device. The method includes the steps of generating a first set of responses from the device at a first frequency in response to a first timing signal, and generating a second set of responses from the device at a second frequency in response to a second timing signal. The method includes the further steps of receiving the first and second sets of responses from the device, and processing the received responses to identify responses that are in synchronization with the first timing signal and responses that are in synchronization with the second timing signal. These timing signals may be related to clock signals applied to the electrical device, to clock signals internally generated by the device, or to extraneous noise that affects the electrical device in some fashion.

20 Claims, 4 Drawing Sheets

METHOD AND APPARATUS FOR IMPROVED DETECTION OF MULTISYNCHRONOUS SIGNALS TITLE

BACKGROUND OF THE INVENTION

1. Field of the Invention

The present invention relates generally to electrical devices that utilize a timing trigger to synchronize an input signal or set of signals. Specific examples of such devices are utilized in systems such as PICA, which involve the detection of optical signals generated by Integrated Circuit devices. However, the invention is not limited to this specific class of devices.

2. Background Art

The present implementation of many detection schemes, including optical signal detection schemes such as PICA, assume the use of a single timing reference source, or trigger. In a PICA detection scheme, as an example, incoming photons are converted to an electrical signal utilizing an appropriate detector. Timing measurements of the electrical signals are made by synchronization with respect to the trigger. Since the trigger typically recurs many times per second, these timing measurements are accumulated or averaged with respect to this trigger.

The scheme described above results in the gradual improvement of signal-to-noise ratio, as the results from increasing numbers of events or triggers are accumulated. This is because the desired measurement is by design synchronized with the trigger, and hence random events such as thermally generated noise will tend to "average out" or diminish to approximately a background level, while the desired signal will be reinforced, eventually becoming detectable with some precision. Not only will random noise be "averaged out," in fact, an often desirable attribute of this scheme is that nonrandom frequency components of the signal or noise that are not synchronized with the trigger will also be attenuated.

However, in some cases it is desirable to have the ability to detect signal components that are "out of sync" with the trigger. For example, in some implementations of PICA, optical signals are detected from an area that may include many independent devices. It is possible that some of these devices may be switching at one frequency or set of frequencies, while other devices switch at a different, asynchronous frequency. In that case, the timing signal from devices that switch at frequencies asynchronous to the clock will be lost or attenuated. In order to capture the desired, asynchronous signal, the measurement must be repeated, this time using a different trigger that is synchronized with the desired time pattern. In cases where three independent frequencies are present, the measurement could be repeated three times, etc.

There is, therefore, a need in the prior art for a system which can simultaneously capture timing information with respect to two or more triggers, eliminating the need to make multiple measurements in order to detect the presence or absence of the relevant frequency components.

SUMMARY OF THE INVENTION

An object of this invention is to improve methods and systems for measuring output signals from electrical devices.

Another object of the invention is to capture simultaneously timing information from an electrical device with respect to two or more timing signals. These timing signals may be related to clock signals applied to the electrical device, to clock signals internally generated by the device, or to extraneous noise that affects the electrical device in some fashion.

A further object of the present invention is to provide signal processing systems that are well suited for use with multisynchronous PICA systems.

These and other objective are attained with a method and system for processing timing information from an electronic device. The method comprises the steps of generating a first set of responses from the device at a first frequency in response to a first timing signal, and generating a second set of responses from the device at a second frequency in response to a second timing signal. The second frequency may or may not be the same as the first frequency. If the two frequencies are the same, then additional test conditions, initiated states, or circuit stimuli may be combined to produce distinct first and second responses which are synchronized, respectively, to the first and second tiling signals.

The method comprises the further steps of receiving the first and second sets of responses from the device, and processing the received responses to identify responses that are in synchronization with the first timing signal and to identify responses that are in synchronization with the second timing signal. These timing signals may be related to clock signals applied to the electrical device, to clock signals internally generated by the device, or to extraneous noise that affects the electrical device in some fashion.

A number of specific processing options may be used. A first method of using multiple triggers involves performing simultaneously those measurements which could be done by the unmodified, single trigger system, by performing a series of measurements. A second method of using multiple triggers involves removal of events in one domain from the data set of the second and/or subsequent domains.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
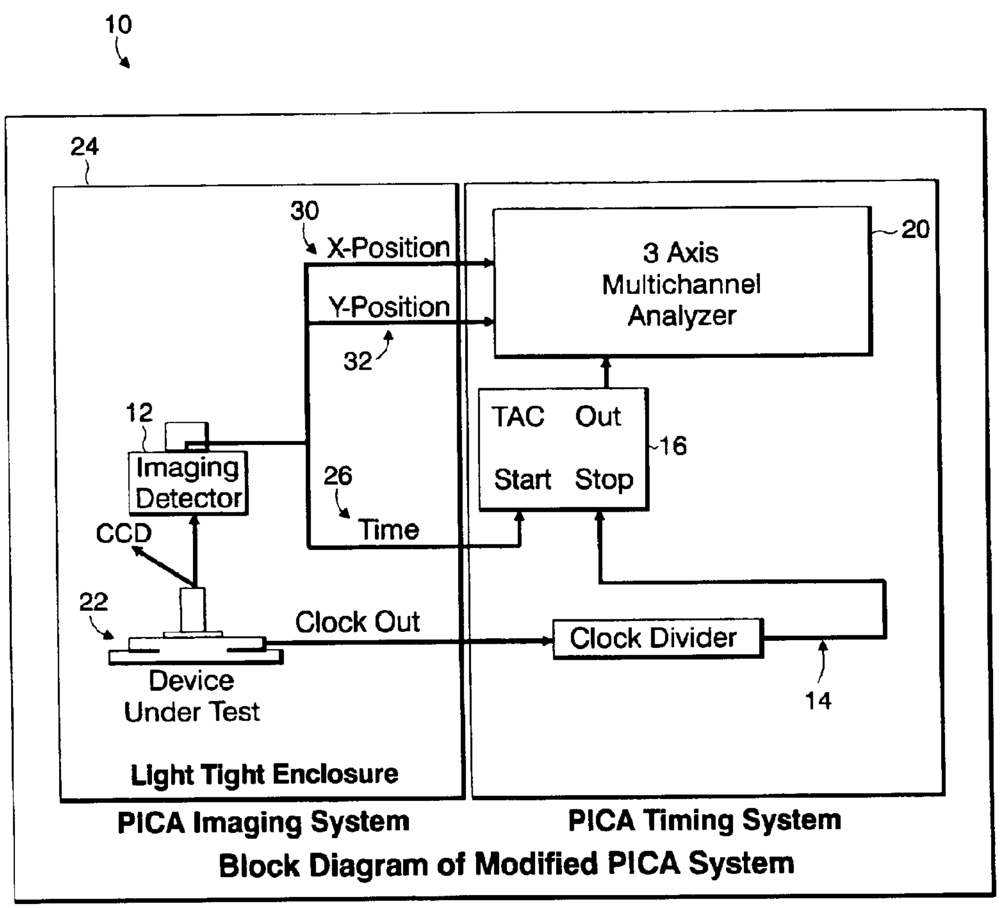
FIG. 1 is a block diagram of a typical prior art PICA system.

FIG. 1 is a block diagram showing a typical PICA system, generally referenced at 10. System 10 includes a detector 12, one or more triggers 14, time measuring means 16 and analyzer 20. Also shown in FIG. 1 is a device 22 under test and a light tight enclosure 24, which houses detector 12 and device 22. This device 22 under test may be, for example, an integrated circuit comprised of a multitude of individual switching circuits.

Detector 12, which may be an Imaging Detector, detects photons emitted from device 22, and generates a time varying output signal 26, referred to as Time. The detector may provide additional signals 30 and 32, denoted as X-position and Y-position, respectively, which indicate the position of the device 22 from which the photons are emitted. Trigger or triggers 14 related to a signal or signals applied to, or generated by, the device 22, to cause that device to emit photons in a characteristic way. For example, a clock signal may be used to cause individual switching circuits of the device 22 to switch states, which results in the emission of photons from those individual switching devices.

Trigger or triggers 14 may be derived from the device 22 under test, or instead from a Tester or Signal Generator. It should be noted that, although multiple triggers may be available with prior art systems, only one is used at any given time. The time measuring means 16 is used to measure the elapsed time between the Time signal and the Trigger, denoted by TAC (Time to Amplitude Converter). Analyzer 20, which may be a Multichannel Analyzer, is used as a means of storing and accumulating successive measurements.

Figure 2:
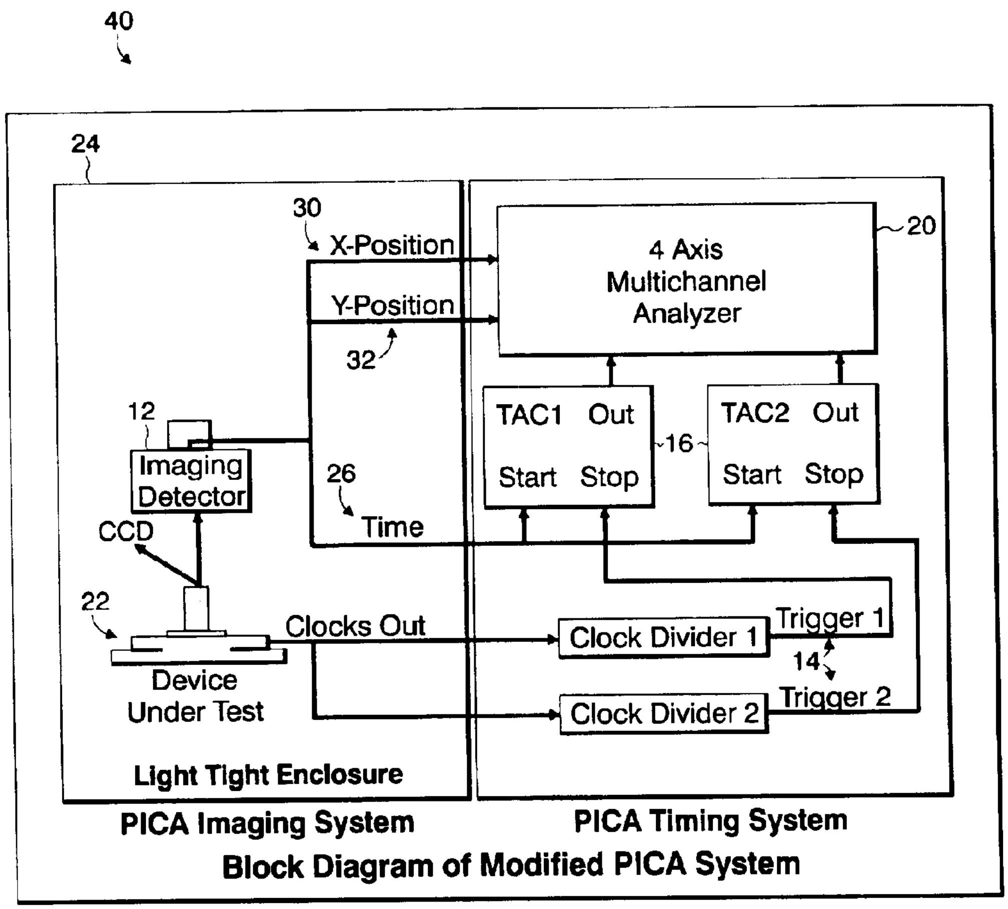
FIG. 2 is a block diagram of a PICA system embodying the present invention.

FIG. 2 is a block diagram showing a PICA system, generally referenced at 40, embodying the present invention. Like system 10, system 40 includes a detector 12, one or more triggers 14, and analyzer 16. System 40, in contrast to system 10, includes a plurality of time measuring means 16. FIG. 2 shows, in addition, a device 22 under test, which again may be an integrated circuit comprised of a multitude of individual switching circuits, and a light tight enclosure 24, which houses detector 12 and device 22. In system 40, two or more triggers may be used simultaneously.

Signal Processing Options for Multisynchronous PICA System

In system 40, events occurring in synchronization to one or more Triggers are to be measured. Several methods may be used to do this.

A first method of using multiple triggers involves performing simultaneously those measurements which could be done by the unmodified, single trigger system, by performing a series of measurements. Performing the measurements simultaneously instead of sequentially, it may be noted, is advantageous in terms of measurement time as well as reduced likelihood of one or more measurements being corrupted by extraneous factors, making the ultimate analysis problematic.

Figure 3:
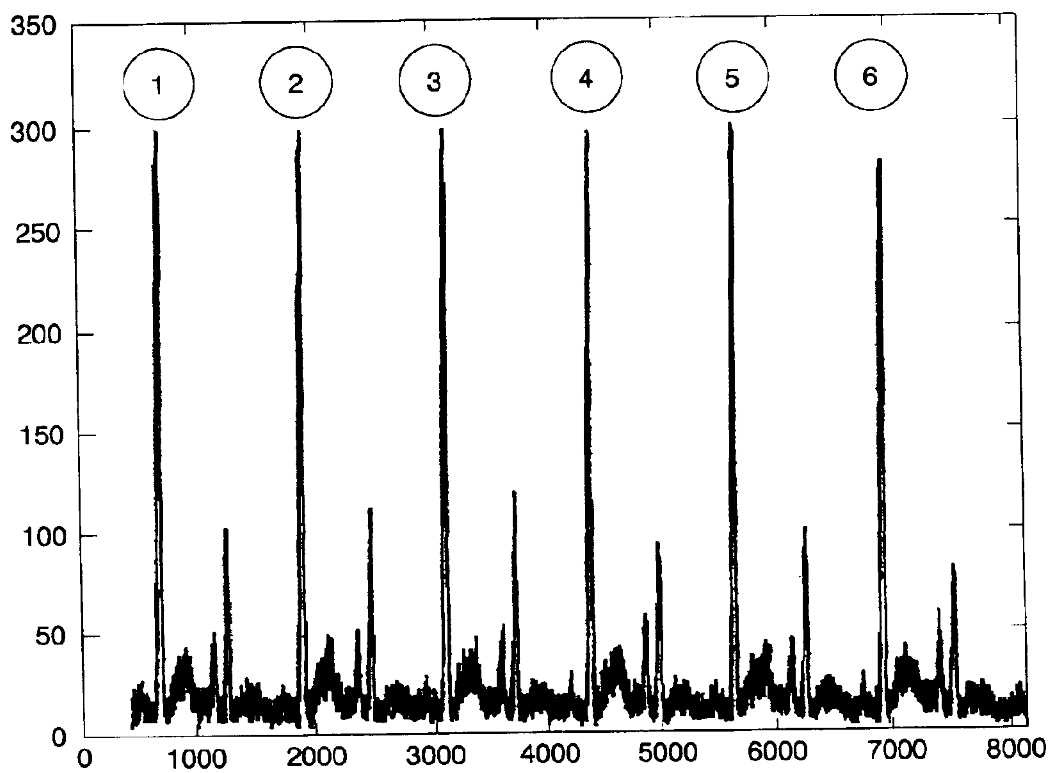
FIG. 3 shows the photon output of a semiconductor over a given time period.

A second method of using multiple triggers involves removal of events in one domain from the data set of the second and/or subsequent domains. For example, suppose one timing trigger is synchronized with frequency F1. When one of the triggers is derived from F1, it is apparent that some event or series of events is synchronized with F1. As illustrated in FIG. 3, for example, events denoted 1, 2, 3, 4, 5 and 6 are clearly synchronized with the timing trigger.

Figure 4:
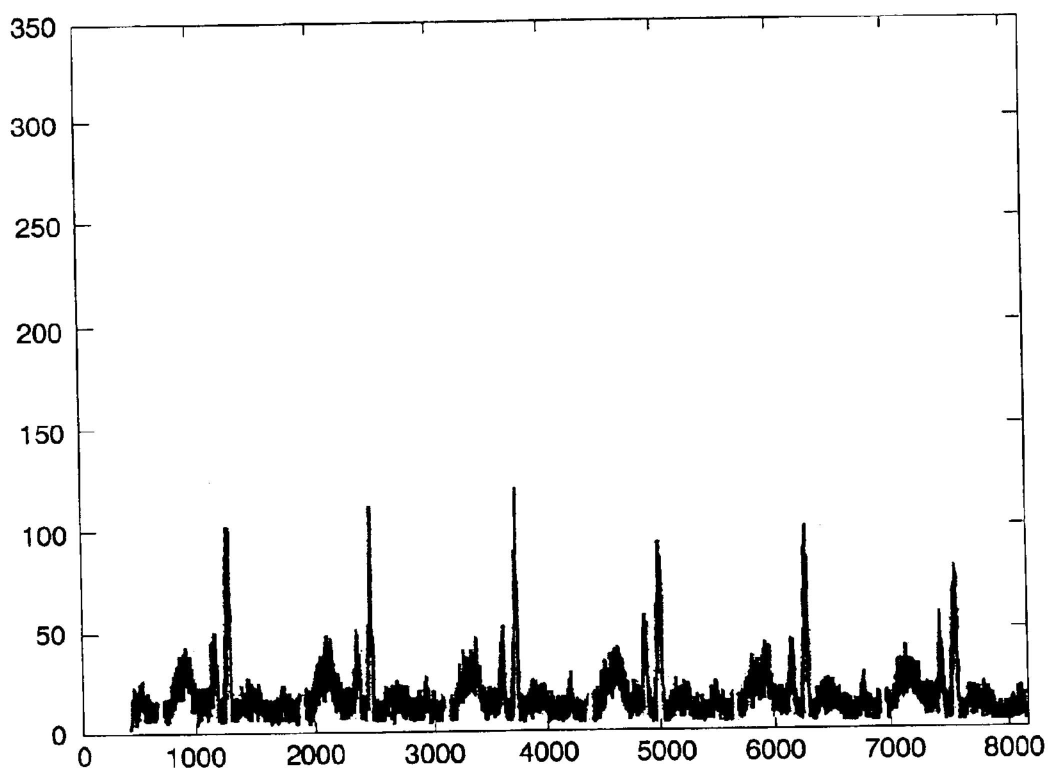
FIG. 4 shows the photon output of FIG. 3 with some events removed.

In a photon counting system such as PICA, each "event" such as those denoted 1, 2, 3, 4, 5 and 6 as above actually is comprised of thousands of individual photons; in these cases there are about 8000 photons per event. The total waveform shown in FIG. 3 is comprised of about 160,000 photons. It is possible to exclude the photons which represent events 1–6 from the data set. Once this is done, as represented in FIG. 4, the remaining data set may be re-analyzed with respect to a second timing trigger T2. The result is an improved signal to noise ratio with respect to T2.

Another example of event removal is the case in which some photons detected are the result of a light leak. By multidimensional analysis, those photons which were synchronized with a defined source, for example room lighting, may be removed while leaving undisturbed those photons which were the result of events occurring in the device under test.

The process of event removal is most evident in the case of a photon counting system, however, the same principle can be applied to other types of time varying signals as well.

Another example of multidimensional analysis is in analyzing the performance of a phase locked loop. Here one may synchronize an internal clock to an external clock. The degree to which this synchronization is successful can be critical to the performance of the system. By performing a PICA measurement with respect to the internal and external clocks simultaneously, system performance variation due to local factors can be separated from performance variation stemming from lack of synchronization to the external clock, thereby measuring the degree of lack of synchronization, also know as jitter.

It should also be noted that it is not necessary to use trigger signals in the practice of this invention, and any timing signal can be used. The timing signals may be related to clock signals applied to the electric device, to clock signals internally generated by the device, or to extraneous noise that affects the electrical device in some fashion.

To elaborate, digital circuits generally use some sort of a periodic clock. In some cases, there can be more than one clock for a given chip, and a portion of the circuitry works off, for example, Clock 1 and the rest works off Clock 2. Also, the clock can be applied to the circuit externally, but sometimes the clock is generated on the chip itself. A trigger is a related, but different, concept. The trigger is what gives a timing reference to the data acquisition system, be it an oscilloscope, or the PICA electronics.

For example, a trigger may come once for every ten clock cycles. The specific number is not essential, and what is important is that the trigger is related to the clock frequency, which drives the digital circuit under test. Thus, the trigger is not necessarily applied to the circuit, but the trigger is related to the clock. For multiple timing domains, there may be multiple clocks and multiple triggers. Also, there can be noise sources (such as the room lights) and a corresponding trigger signal which is related to the room lights.

While it is apparent that the invention herein disclosed is well calculated to fulfill the objects previously stated, it will be appreciated that numerous modifications and embodiments may be devised by those skilled in the art, and it is intended that the appended claims cover all such modifications and embodiments as fall within the true spirit and scope of the present invention.

What is claimed is:

1. A method of processing timing information from an electronic device, comprising the steps of:

generating a first set of responses from the device in response to a first stimulus, each of said first set of responses representing one or more events of a first series of events;

generating a second set of responses from the device at a second frequency in response to a second stimulus, each of said second set of responses representing one or more events of a second series of events, said second series of events occurring simultaneously with said first series of events;

receiving the first and second sets of responses from the device; and processing the received first and second sets of responses to distinguish said first series of events from said second series of events, and to identify responses that are in synchronization with the first stimulus and to identify responses that are in synchronization with the second stimulus.

2. A method according to claim 1, wherein the processing step includes the step of using a single analyzer to measure simultaneously the first and second sets of responses from the electronic device.

3. A method according to claim 1, wherein the processing step includes the steps of:

measuring the first and second sets of responses; and averaging said measurements over a period of time to distinguish said first and second series of events.

4. A method of processing timing information from an electronic device, comprising the steps of:

generating a first set of responses from the device in response to a first stimulus;

generating a second set of responses from the device at a second frequency in response to a second stimulus;

receiving the first and second sets of responses from the device; and processing the received responses to identify responses that are in synchronization with the first stimulus and to identify responses that are in synchronization with the second stimulus; and wherein the processing step includes the steps of:

measuring the received responses to obtain a full data set; and subtracting from the full data set, a data set representing the first set of responses to obtain a data set representing the second set of responses.

5. A method of processing timing information from an electronic device, comprising the steps of:

generating a first set of responses from the device in response to a first stimulus;

generating a second set of responses from the device at a second frequency in response to a second stimulus;

receiving the first and second sets of responses from the device; and processing the received responses to identify responses that are in synchronization with the first stimulus and to identify responses that are in synchronization with the second stimulus; and wherein:

the first stimulus is a clock signal external of the electronic device;

the second stimulus is a clock signal internal of the electronic device; and the processing step includes the step of processing the received responses to synchronize the internal clock signal with the external clock signal.

6. A method of processing timing information from an electronic device, comprising the steps of:

generating a first set of responses from the device in response to a first stimulus;

generating a second set of responses from the device at a second frequency in response to a second stimulus;

receiving the first and second sets of responses from the device; and processing the received responses to identify responses that are in synchronization with the first stimulus and to identify responses that are in synchronization with the second stimulus; and wherein:

the electronic device is an integrated circuit including a multitude of individual switching circuits;

the first stimulus causes a first group of the switching circuits to switch states in synchronization with the first stimulus;

said first group of switches emit photons when the first group of switches switch states, and/or in varying degrees depending on their state;

the second stimulus causes a second group of the switching circuits to switch states in synchronization with the second stimulus; and said second group of switches emit photons when the second group of switches switch states, and/or in varying degrees depending on their state.

7. A method according to claim 6, wherein:

the receiving step includes the step of receiving the photons emitted from the first and second groups of switches; and the processing step includes the steps of i) converting the received photons to an electric signal, and ii) analyzing said electrical signal to identify a first component of said electrical signal representing the photons emitted from the first group of switches and to identify a second component of said electrical signal representing the photons emitted from the second group of switches.

8. A method according to claim 7, wherein the step of analyzing the electrical signal includes the step of subtracting said first component from the electrical signal to obtain said second component.

9. A method of processing timing information with respect to a stimulus applied to an electronic device, comprising the steps of:

locating the electronic device in a given environment including at least a first environmental factor causing the electronic device to generate a first set of responses, each of said first set of responses representing one or more events of a first series of events;

applying the stimulus to the device to generate a second set of responses, each of said second sets of responses one or more events of a second series of events, said second series of events occurring simultaneously with said first series of events;

receiving the first and second sets of responses from the device;

processing the received first and second sets of responses to distinguish said first series of events from said second series of events, and to separate the responses due to said environmental factor from the responses due to the stimulus and to identify the responses due to the stimulus.

10. A method according to claim 9, wherein:

the electronic device is an integrated circuit including a multitude of individual switching circuits;

said environmental factor causes at least some of said switching circuit to emit photons; and the timing signal causes at least some of said switching circuits to emit photons.

11. A method of processing timing information with respect to a stimulus applied to an electronic device, comprising the steps of:

locating the electronic device in a given environment including at least a first environmental factor causing the electronic device to generate a first set of responses;

applying a stimulus to the device to generate a second set of responses;

receiving the first and second sets of responses from the device; and processing the received responses to separate the responses due to said environmental factor from the responses due to the stimulus and to identify the responses due to the stimulus; and wherein:

the receiving step includes the step of receiving photons emitted from the switching circuits; and the processing step includes the steps of i) converting the received photons to an electric signal, and ii) analyzing said electric signal to identify a first component of the electric signal representing photons emitted from the switching circuits due to the environmental factor, and to identify a second component of the electric signal representing photons emitted from the switching circuits due to the stimulus.

12. A method according to claim 11, wherein said environmental factor is room lighting.

13. A system for processing timing information from an electronic device, comprising:

means for applying a first stimulus to the device, wherein in response to the first stimulus, the device generates a first set of responses, each of said first set of responses representing one or more events of a first series of events;

means for applying a second stimulus to the device, wherein in response to the second stimulus, the device generates a second set of responses, each of said second stet of responses representing one or more events of a second series of events, said second series of events occurring simultaneously with said first series of events;

a detector for receiving the first and second sets of responses from the device; and a processor for processing the received first and second sets of responses to distinguish said first series of events from said second series of events, and to identify responses that are in synchronization with the first stimulus and to identify responses that are in synchronization with the second stimulus.

14. A system according to claim 13, wherein the processor is a single analyzer to measure simultaneously the first and second sets of responses from the electronic device.

15. A system for processing timing information from an electronic device, comprising:

means for applying a first stimulus to the device, wherein in response to the first stimulus, the device generates a first set of responses;

means for applying a second stimulus to the device, wherein in response to the second stimulus, the device generates a second set of responses;

a detector for receiving the first and second sets of responses from the device; and a processor for processing the received responses to identify responses that are in synchronization with the first stimulus and to identify responses that are in synchronization with the second stimulus; and wherein the processor includes:

means for measuring the received responses to obtain a full data set; and means for subtracting from the full data set, a data set representing the first set of responses to obtain a data set representing the second set of responses.

16. A system for processing timing information from an electronic device, comprising:

means for applying a first stimulus to the device, wherein in response to the first stimulus, the device generates a first set of responses;

means for applying a second stimulus to the device, wherein in response to the second stimulus, the device generates a second set of responses;

a detector for receiving the first and second sets of responses from the device; and a processor for processing the received responses to identify responses that are in synchronization with the first stimulus and to identify responses that are in synchronization with the second stimulus; and wherein:

the means for applying the first stimulus is a clock external of the electronic device;

the means for applying the second stimulus is a clock internal of the electronic device; and the processing step includes the step of processing the received responses to synchronize the internal clock signal with the external clock signal.

17. A system for processing timing information from an electronic device, comprising:

means for applying a first stimulus to the device, wherein in response to the first stimulus, the device generates a first set of responses;

means for applying a second stimulus to the device, wherein in response to the second stimulus, the device generates a second set of responses;

a detector for receiving the first and second sets of responses from the device; and a processor for processing the received responses to identify responses that are in synchronization with the first stimulus and to identify responses that are in synchronization with the second stimulus; and, wherein:

the electronic device is an integrated circuit including a multitude of individual switching circuits;

the first stimulus causes a first group of the switching circuits to switch states in synchronization with the first stimulus;

said first group of switches emit photons when the first group of switches switch states, and/or in varying degrees depending on their state;

the second stimulus causes a second group of the switching circuits to switch states in synchronization with the second stimulus; and said second group of switches emit photons when the second group of switches switch states, and/or in varying degrees depending on their state.

18. A system according to claim 17, wherein:

the detector includes means for receiving the photons emitted from the first and second groups of switches and for converting the received photons to an electric signal; and the processor includes means for analyzing said electric signal to identify a first component of said electric signal representing the photons emitted from the first group of switches and to identify a second component of said electric signal representing the photons emitted from the second group of switches.

19. A system according to claim 18, wherein the means for analyzing the electric signal includes means for subtracting said first component from the electric signal to obtain said second component.

20. A system for processing timing information from an electronic device, comprising:

means for applying a first stimulus to the device, wherein in response to the first stimulus, the device generates a first set of responses;

means for applying a second stimulus to the device, wherein in response to the second stimulus, the device generates a second set of responses;

a detector for receiving the first and second sets of responses from the device; and a processor for processing the received responses to identify responses that are in synchronization with the first stimulus and to identify responses that are in synchronization with the second stimulus; and wherein:

the device generates the first set of responses at a first frequency;

the device generates the second set of responses at a second frequency;

the first and second frequencies may or may not be the same;

the first stimulus is related to the application of a specific first set of circuit stimuli, resulting in a first time varying pattern of photon emissions from some or all circuits on the chip;

the second stimulus is related to the application of a specific second set of circuit stimuli, resulting in a second time varying pattern of photon emissions from some or all circuits on the chip; and the application of said first and second sets of circuit stimuli optionally being interwoven in any desired fashion.

* * * * *